(12) United States Patent
Suri et al.

(10) Patent No.: US 7,257,507 B1
(45) Date of Patent: Aug. 14, 2007

(54) SYSTEM AND METHOD FOR DETERMINING PROBING LOCATIONS ON IC

(75) Inventors: Hitesh Suri, San Jose, CA (US); Cathy Kardach, Saratoga, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/471,068

(22) Filed: Jun. 19, 2006

Related U.S. Application Data

(63) Continuation of application No. 11/345,004, filed on Jan. 31, 2006.

(60) Provisional application No. 60/774,991, filed on Feb. 17, 2006.

(51) Int. Cl.
*G06F 11/00* (2006.01)

(52) U.S. Cl. .............. 702/117; 714/25; 438/16

(58) Field of Classification Search ........... 702/117, 702/118; 438/14–18; 714/25; 700/96–98
See application file for complete search history.

(56) References Cited

U.S. PATENT DOCUMENTS 6,567,967 B2 * 5/2003 Greidinger et al. ......... 716/10
6,608,494 B1   8/2003 Bruce et al.
6,788,093 B2   9/2004 Aitren et al.

OTHER PUBLICATIONS

Desplats, Romain, et. al., "IC Diagnostic with Time Resolved Photon Emission and CAD Auto-channeling," *Proceedings from the 29th International Symposium for Testing and Failure Analysis*, Nov. 2-6, 2003, Santa Clara, California.
"LAVIS: The Future of Layout Viewer," Mar. 2005, Tool Corporation.

* cited by examiner

*Primary Examiner*—Edward Raymond
(74) *Attorney, Agent, or Firm*—Sughrue Mion, PLLC; Joseph Bach

(57) ABSTRACT

An apparatus and method for tracing back a probing location to identify the circuit element being probed on a device under test (DUT). The coordinates of the irregularity on the DUT are used to trace back to the logic cone to decipher the root-cause of the irregularity. The Def and Lef files are interrogated using the coordinates to obtain the cell and net data to enable the investigation. Additionally, a schematic viewer is used to investigate the logic cone to potential root-causes for the irregularities.

29 Claims, 10 Drawing Sheets

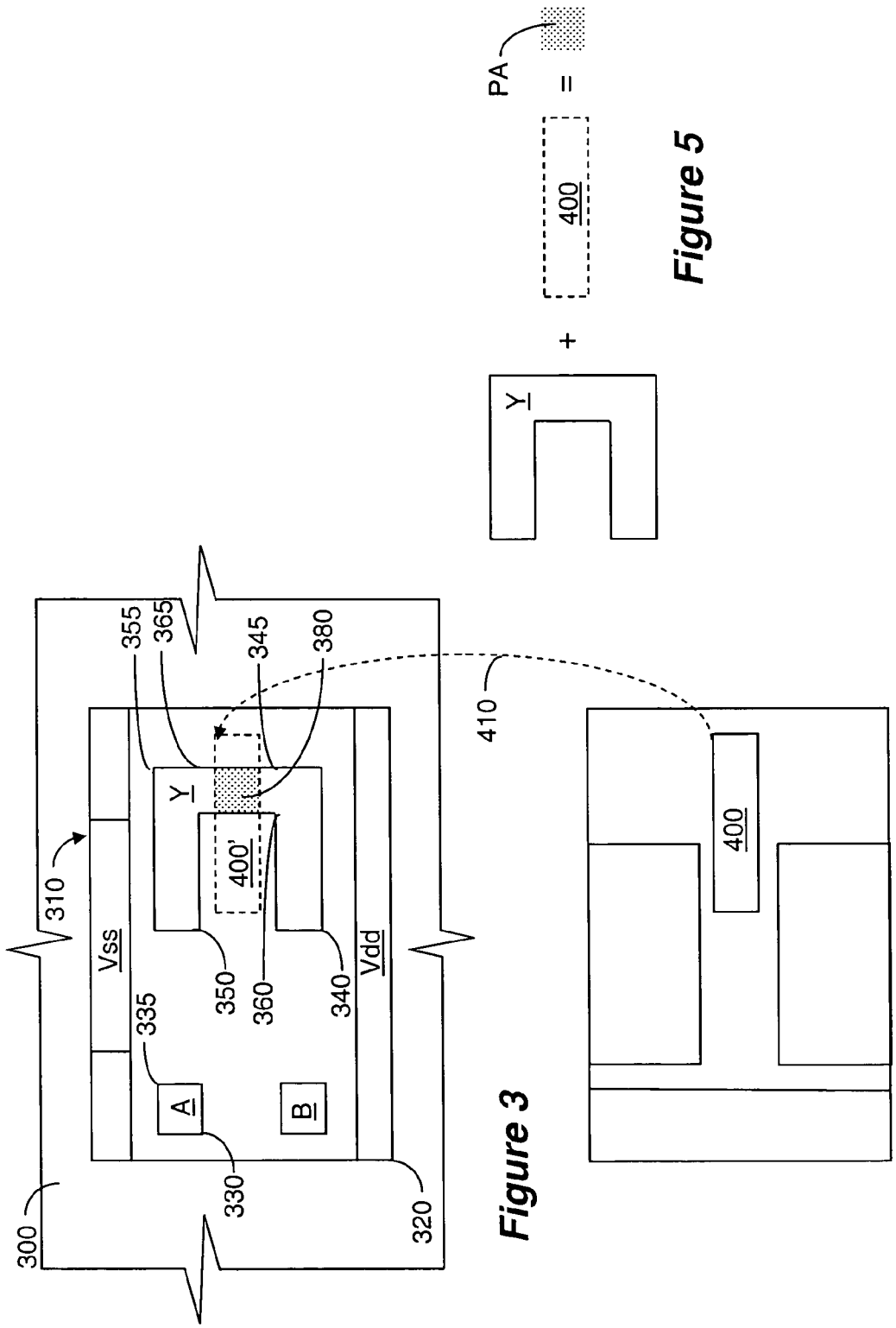

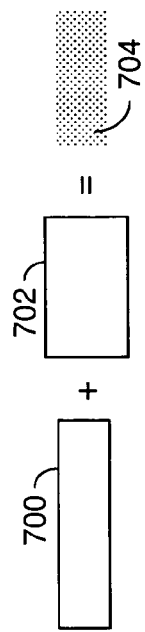
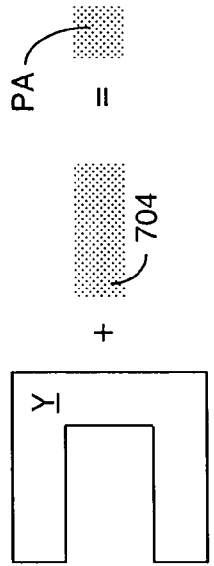
*Figure 8A*
*Figure 8B*
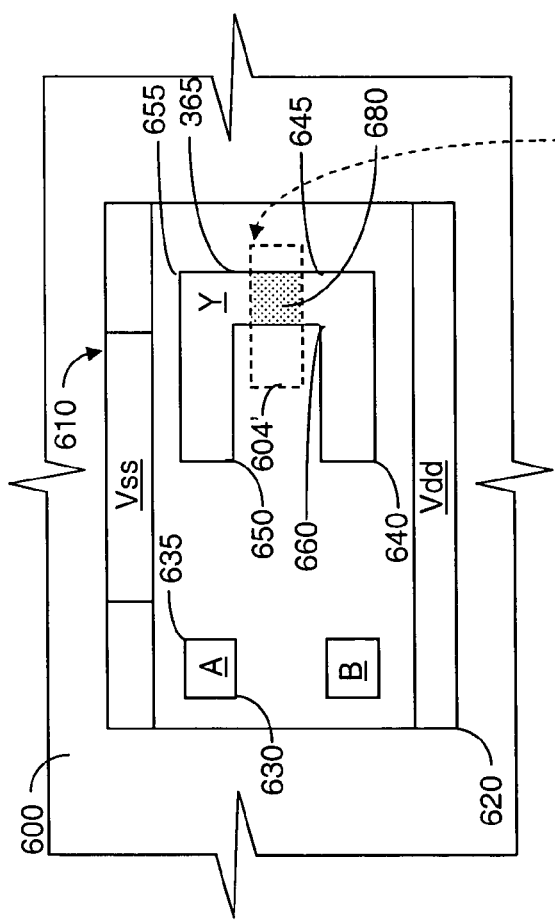
*Figure 6*
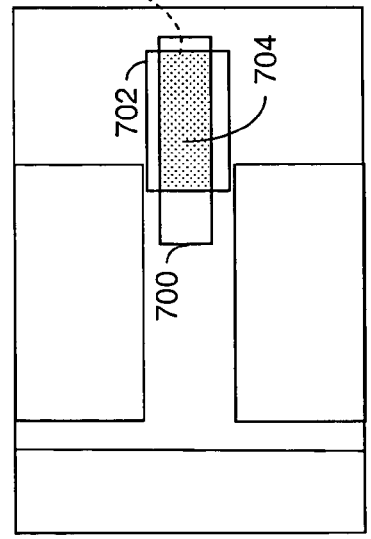
*Figure 7*

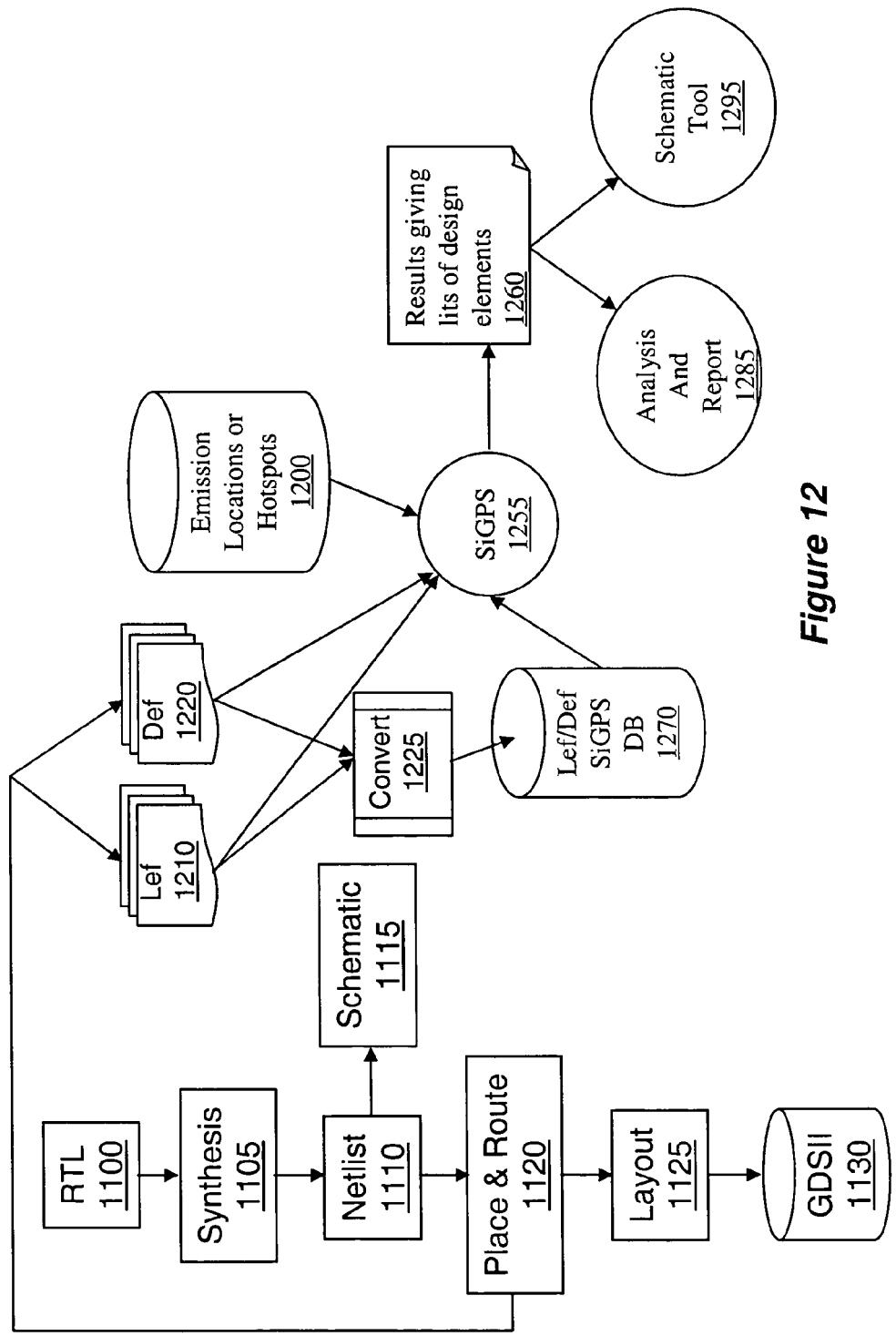

SYSTEM AND METHOD FOR DETERMINING PROBING LOCATIONS ON IC

CROSS-REFERENCE TO RELATED APPLICATIONS

This application claims priority from, and is a continuation in part of U.S. application Ser. No. 11/345,004, filed Jan. 31, 2006 and commonly assigned to the current assignee, and which is incorporated herein by reference in its entirety. This case also claims priority from U.S. Application Ser. No. 60/774,991, filed Feb. 17, 2006, which is incorporated herein by reference in its entirety.

BACKGROUND

1. Field of the Invention

The present invention relates to an apparatus and method for finding exact locations for probing integrated circuits, and conversely tracing the circuit element and location of a suspected spot on a DUT (device under test) probed by a probing tool.

2. Description of the Related Art

Probing systems have been used in the art for testing and debugging integrated circuit (IC) designs and layouts. Various laser-based systems for probing IC's are known in the prior art. In these prior art systems, the DUT is driven by an electrical test signal, while a laser beam is used to illuminate the DUT. The laser beam then reflects from the DUT, and the reflection is perturbed according to the DUT's response to the electrical test signals. The reflected beam is then converted to an electrical signal having a waveform corresponding to the reflected beam. This waveform is displayed for the user's analysis.

Some of the test and debug technique used in the prior art include LIVA (Light Induced Voltage Alteration), TIVA (Thermally Induced Voltage Alteration), CIVA (Charge Induced Voltage Alteration), XIVA (Externally Induced Voltage Alteration), OBIC (Optical Beam Induced Current), OBHIC (Optical Beam Heat Induced Current), and OBIRCH (Optical Beam Induced Resistance Change). These techniques probe the DUT to detect a change in the characteristics of certain devices or structures therein to thereby detect a failure or an area that is prone to fail or adversely affect the DUT's performance. According to these techniques, the DUT is driven by an electrical signal, while a laser beam is used to illuminate the DUT to thereby cause either heating, carrier generation, or both. As a result, the electrical output from the DUT is perturbed, and this perturbation is detected and analyzed. That is, under these techniques the laser beam is used only as a perturbing agent, but the detection is done by analyzing the electrical output from the DUT.

Other probing techniques are based on the observation that active devices, such as transistors, emit light upon switching of state. In these systems, the DUT is also energized by test vectors, but no light is used to illuminate the DUT. Rather, an optical system is used to collect the faint light that is emitted upon the switching of the transistor being probed. This techniques is generally referred to in the industry as time-resolved emission (TRE) or time-resolved photon emission (TRPE). A system for performing TRPE probing is commercially available under the trade name EmiScope™ from Credence Systems Corporation of Milpitas, Calif.

As is known in the art, in order to probe the DUT and obtain meaningful analysis, the location of the probed devices must be specified as accurately as possible. This is especially true for TRPE, as the location from which emission emanates is very small, so that accurate placement of the collection optics is imperative for proper emission collection and proper identification of the device that emits the photons.

FIG. 1A is a schematic of prior art method of identifying probing locations on a DUT. In order to test a DUT, first test patterns (also referred to as test vectors) are generated by an automatic test pattern generator, ATPG 105. The test patterns are then fed to the automated testing equipment (also referred to as automated testing and evaluation) ATE 110. The ATE feeds the test vectors to the DUT, 145, and tests the electrical response of the DUT to the test patterns. The ATE then generates a log of fail results, 115, identifying scan chains and test patterns having failures. The log, 115, is then input to an analysis tool, 120, which performs fault simulation using the log so as to determine potential cells or pins that may be faulty. As is shown by the broken-line double arrow, some commercially available ATPG's contain mechanism to also perform the analysis, so while two separate tools are shown, the generation of test vectors and the analysis of the fail log can be done by the same tool. The analysis tool performs fault simulation to determine potential causes for the fault and then outputs a callout log, 125, which lists all of the cell names and related pins that are likely to result in detection of failures.

The cells and pins identified in the callout list may not be the actual cause of the failures. Therefore, it is a practice in the art to use a debug tester, such as a TRPE tool to investigate the actual cause for the fault. For that purpose, the callout log is used to determine which locations to probe with the TRPE tool. That is, using the callout list a debug engineer needs to perform various manual procedures, 150, to determine where to place the prober. The manual procedure involve reviewing various design databases, 130, reviewing the layout vs. schematic, LVS 135, and reviewing layout designs, 140, so as to provide the results, 160, normally in terms of the coordinates of the corner of the cell to be probed.

As can be understood, the methods used in the prior art to arrive at probing locations are tedious and time consuming. Additionally, in most instances only the coordinates of the corner of the cell to be investigated is obtained, and the prober needs to be scanned over the cell to find the actual proper location for probing. Therefore, there is a need in the art for an automated system that provides more detailed information regarding the locations to be probed.

Conversely, in cases where a fault location is detected by the prober, it is currently difficult to determine the corresponding circuit element that is probed. That is, the prober provides only the coordinates of the probing location with respect to the DUT. However, the prober provides no information with respect to layout or circuit design of the DUT, so that the circuit element that emits the light is not readily identifiable. FIG. 1B depicts a general process of the prior art for determining the circuit element that may be responsible for the emission spot. As shown, the location, 100, in terms of X,Y CAD coordinates on the DUT is obtained from the prober. The engineers go manually through various databases, such as design databases 130, layout vs. schematics database 135, and layout tools 140, to determine the candidate elements, 160, that may be the cause. Therefore, there is a need in the industry to provide a system and method to trace back a coordinate location of a probing location to a circuit element in the DUT layout and design.

SUMMARY

Various embodiments of the present invention provide apparatus and method for determining the proper locations for probing of a DUT. Other embodiments of the present invention provide apparatus and method for determining the proper locations for probing of a DUT and automatically controlling a stage so that the testing equipment is aligned to the proper location. Yet other embodiments of the present invention provide apparatus and method for tracing back a probing location to identify the circuit element being probed.

According to an aspect of the invention, a method for identifying an area of the chip to be probed proceeds as follows. A callout list of failures is obtained from a tester, the callout list including cell name and pin for each failure. A Def file is interrogated to locate a Def entry matching the cell name, and a cell type, cell location, and cell orientation data is obtained for the cell name from the Def file. A Lef file is then interrogated to locate a Lef entry matching the cell type, and the coordinates of the pin are obtaining from the Lef file. A GDS file is then interrogated to locate a GDS entry matching the cell type, and the coordinates of polygons listed in the GDS entry are obtained. The coordinates of the pin are then crossed with the coordinates of the polygons to identify overlapping area. The overlapping area is defined as the location to be probed.

According to another aspect of the invention, a method for identifying an area of the chip to be probed proceeds as follows. A callout list of failures is obtained from a tester, the callout list including cell name and pin for each failure. A Def file is interrogated to locate a Def entry matching the cell name, and a cell type, cell location, and cell orientation data is obtained for the cell name from the Def file. A Lef file is then interrogated to locate a Lef entry matching the cell type, and the coordinates of the pin are obtaining from the Lef file. A GDS file is then interrogated to locate a GDS entry matching the cell type, and the coordinates of diffusion and poly layer polygons listed in the GDS entry are obtained. The diffusion polygons are crossed with the poly layer polygons to obtain crossed GDS coordinates. The coordinates of the pin are then crossed with the crossed coordinates of the GDS to identify overlapping area. The overlapping area is defined as the location to be probed.

According to another aspect of the invention, a computerized system for determining locations on an integrated circuit microchip to be probed is provided. The system comprising a computer having an input, an output, and a processor. The processor is pre-programmed to perform the steps: a. receive via the input a callout list of failures, the callout list including cell name and pin for each failure; b. interrogate a Def file to locate a Def entry matching the cell name and obtain from the Def entry cell type, cell location, and cell orientation data; c. interrogate a Lef file to locate a Lef entry matching the cell type and obtain from the Lef entry coordinates of the pin; d. interrogate a GDS file to locate a GDS entry matching the cell type and obtain coordinates of polygons listed in the GDS entry; e. perform a Boolean operation on the coordinates of the pin with the coordinates of the polygons to identify overlapping area; and f. output the overlapping area as the location to be probed.

According to yet another aspect of the invention, the computer is pre-programmed to perform the steps: d1. obtain coordinates of diffusion layer polygons and coordinates of poly layer polygons from the GDS entry; and, d2. cross the coordinates of the diffusion layer polygons and the coordinates of the poly layer polygons to thereby obtained coordinates of crossed GDS polygon; and step e comprises perform a Boolean operation on the coordinates of the pin with the coordinates of the crossed GDS polygon to identify overlapping area.

According to still another aspect of the invention, a computerized system for determining locations on an integrated circuit microchip to be probed and controlling a stage to place a prober at the proper location is provided. The system comprising a computer having an input, an output, and a processor. The processor is pre-programmed to perform the steps: a. receive via the input a callout list of failures, the callout list including cell name and pin for each failure; b. interrogate a Def file to locate a Def entry matching the cell name and obtain from the Def entry cell type, cell location, and cell orientation data; c. interrogate a Lef file to locate a Lef entry matching the cell type and obtain from the Lef entry coordinates of the pin; d. interrogate a GDS file to locate a GDS entry matching the cell type and obtain coordinates of polygons listed in the GDS entry; and e. determine from the interrogated files the proper location on the microchip to be probed. The system then provides an output to control the motion of a stage so as to align the prober with the location on the microchip.

According to yet another aspect of the invention, a system and method to trace back a coordinate location of a probing location to a circuit element in the DUT layout and design proceeds as follows. The coordinate of an irregularity on the DUT are determined. The coordinates are used to interrogate the Def/Lef files to obtain cell data. The cell data is used to determine potential commonalities that may cause the irregularity. According another aspect a method for identifying elements on a device under test (DUT) that are suspect of causing irregularities manifested as photoemission locations on the DUT is disclosed. The method comprises receiving spatial coordinates of the photoemissions on the DUT; interrogating a Def file to locate Def entries matching the spatial coordinates and obtaining from the Def entries cell instance name and cell type, of corresponding cells; and interrogating schematic viewer to locate schematic entries matching the cell instance name for each of the cell names. In a further aspect the method further comprises analyzing the schematics entries to determine suspect elements. The analysis may comprise investigating whether all of the corresponding cells are being driven by a common net; investigating whether all of the corresponding cells are being driven by a common net or a plurality of nets; and, if the corresponding cells are driven by a plurality of nets, determining whether the plurality of nets are traceable back to a single parent net; investigating whether all of the corresponding cells are being driven by a common net or a plurality of nets; and, if the corresponding cells are driven by a plurality of nets, determining whether the plurality of nets are traceable back to a single cell instance; investigating whether all of the corresponding cells comprise same type of via structure; investigating whether all of the corresponding cells comprise same routing rules; or investigating whether all of the corresponding cells comprise same cell type.

The method may further comprise interrogating a Lef file to locate Lef entries matching the cell types and obtaining from the Lef entries cell width, cell height, and cell pin data.

According to another aspect, a method for identifying elements on a device under test (DUT) that are suspect of causing irregularities manifested as photoemission locations on the DUT is disclosed, comprising: a. receiving spatial coordinates of the photoemissions on the DUT; b. interrogating a Def file to locate Def entries matching the spatial coordinates and obtaining from the Def entries cell instance name and cell type, of corresponding cells; and, c. interrogate Lef file to obtain entries corresponding to the cell types to obtain cell width, cell height and cell pin data. The method may also comprise using coordinates of each cell pin obtained in step (c) to interrogate the Def file to thereby obtain net name for a net connected to each pin. The method may also comprise obtaining from said Def file for each net name at least one of: net connectivity, pin connectivity, metal level data, and vias data. The method may further comprise using said net connectivity to trace all relating cells connected to said net.

According to yet another aspect of the invention, a system for probing a microchip device under test (DUT) is disclosed, comprising: an adapter for mounting the DUT thereupon; a prober having probing axis; a movable stage providing relative motion between the DUT and the prober so as to align the probing axis with selected locations on the DUT; a controller controlling the stage to thereby place said prober so that said probing axis correspond to determinable coordinates on said DUT; a processor preprogrammed to perform the steps: a. receive said coordinates; b. interrogating a Def file to locate Def entries matching said spatial coordinates and obtaining from said Def entries cell instance name and cell type, of corresponding cells; and, c. interrogate a Lef file to obtain entries corresponding to said cell types to obtain cell width, cell height and cell pin data.

According to one aspect, the prober is an optical prober. According to another aspect the coordinates correspond to a location of the DUT having photoemission event. According to yet another aspect the coordinates correspond to a location of the DUT having an irregular operation. According to still another aspect the coordinates correspond to an area enclosing a location of the DUT having photoemission event. According to yet another aspect, the coordinates correspond to an area enclosing a location of the DUT having an irregular operation. According to still another aspect, the processor is further programmed to perform the step: d. interrogate the Def file using coordinates of each cell pin obtained in step (c) to thereby obtain net name for a net connected to each pin.

Other aspects and features of the invention will become apparent from the description of various embodiments described herein, and which come within the scope and spirit of the invention as claimed in the appended claims.

BRIEF DESCRIPTION OF THE DRAWINGS

FIG. 3 is a schematic of a section of a die illustrating an embodiment of the subject invention.

FIG. 4 is an illustration of fictitious diffusion areas stored in the GDS II files for the cell shown in FIG. 3.

FIG. 5 depicts a cross operation, wherein pin Y is crossed with diffusion area 400, resulting in probing area PA.

FIG. 6 is a schematic of a section of a die illustrating another embodiment of the subject invention.

FIG. 7 depicts a fictitious diffusion layer and a fictitious poly layer corresponding to the die of FIG. 6.

FIGS. 8A and 8B depicts the two step process for crossing the diffusion layer with the poly layer using the GDS II data, and then crossing the result with the pin area obtained from the Lef file.

FIG. 11 is a flow chart of a chip design process according to the prior art.

FIG. 12 is a schematic diagram illustrating an embodiment of the process of the invention.

Figure 1A:
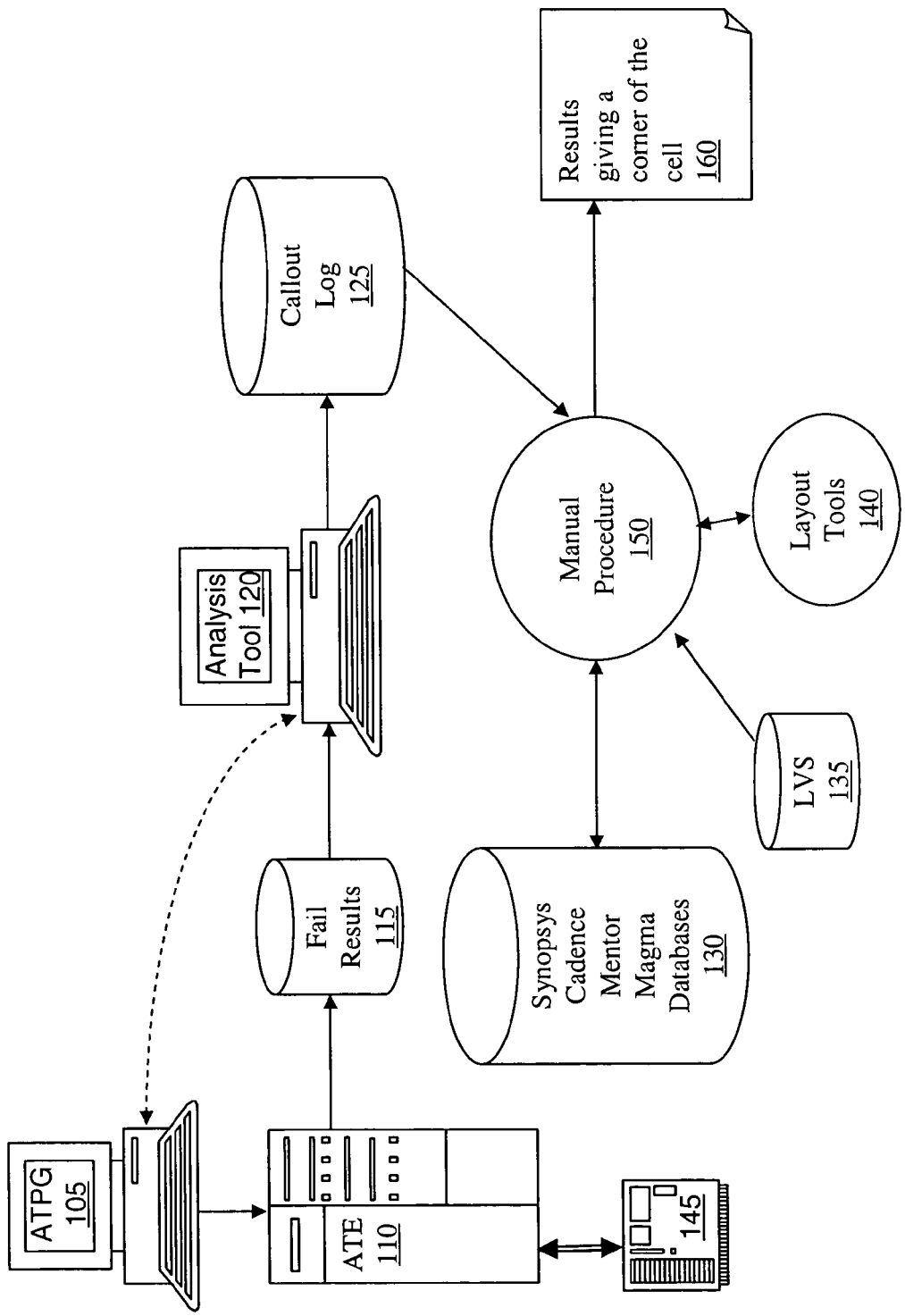
FIGS. 1A and 1B are general schematics depicting procedures according to the prior art.
Figure 1B:
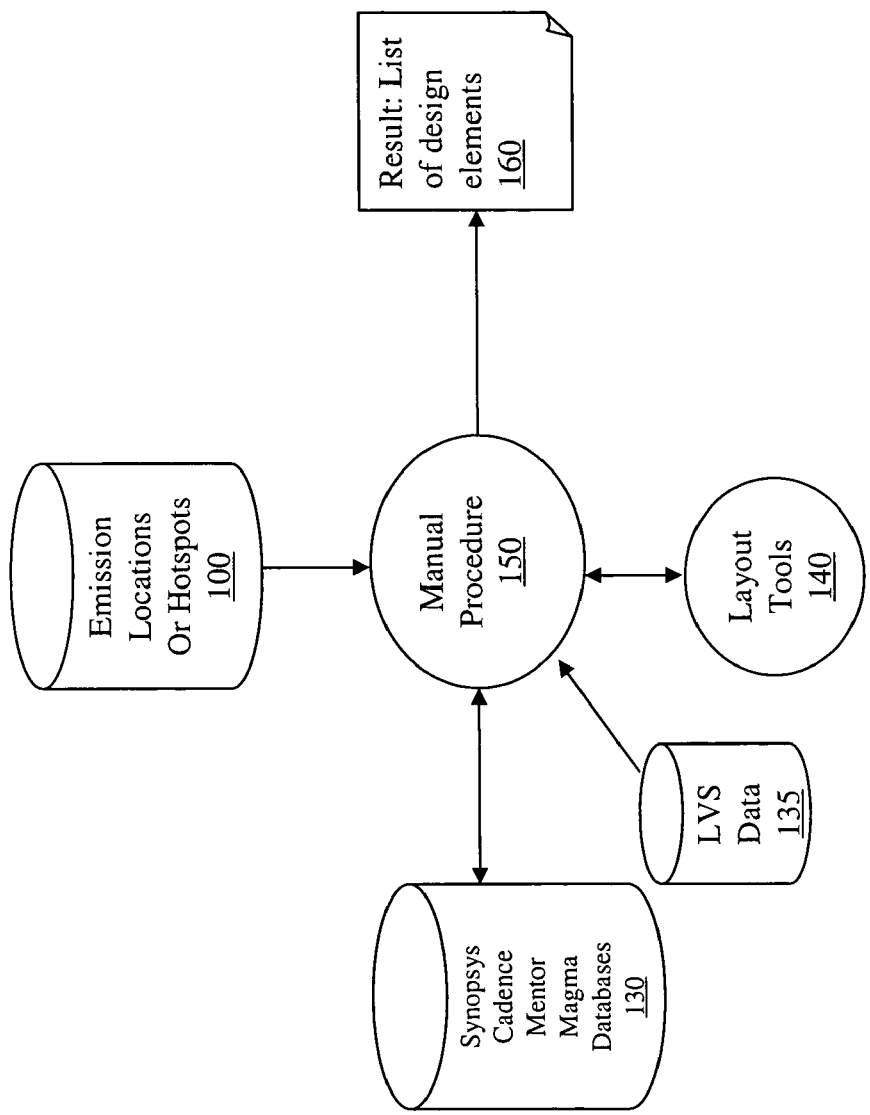

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Figure 2:
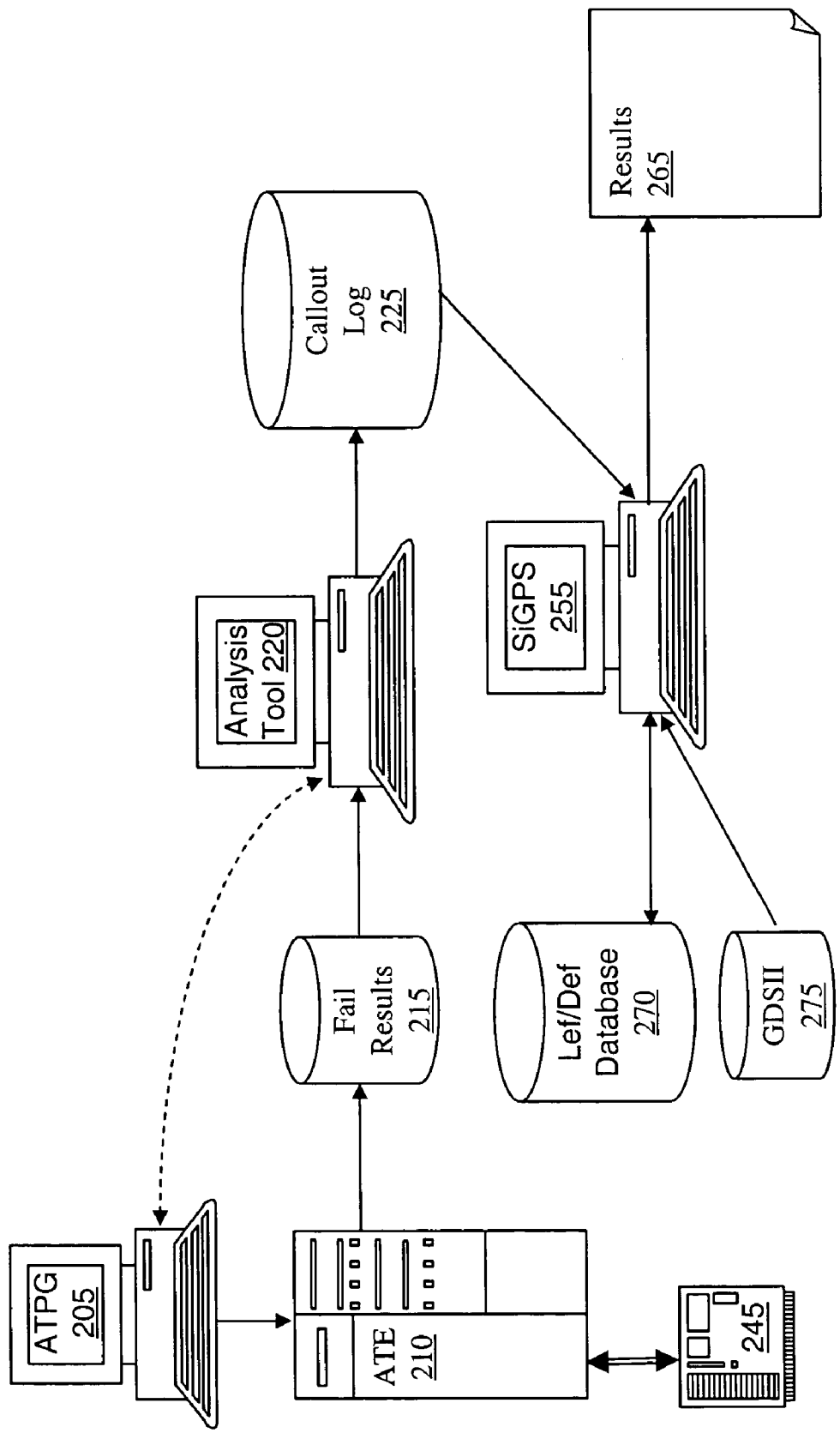
FIG. 2 is a diagram illustrating a first embodiment of the present invention.

FIG. 2 depicts an embodiment of the present invention. In this embodiment, all of the equipment and processes leading to the generation of the callout log 225 are the same as in the prior art. However, according to this embodiment, The Def/Lef and GDSII files are interrogated to produce the results of locations for probing, providing the bounding box of the cell, the pins, and the locations within the cell where TRE probing may be performed. This process is referred to herein as SiGPS and may be done automatically using a specifically programmed computer, such as a PC.

The terms Lef, Def, and GDS are commonly used in the art. Due to increasing size and complexity of the designs, engineers use automated tools to do the floor planning followed by place and route (P&R). During the P&R stage, the design tools have the ability to generate LEF/DEF files. These files are in ASCII format and contain the place and route data. The term Lef is an acronym for Library Exchange Format and is a file that defines the cell design, akin to a "real estate" layout of each cell within the chip. The Lef file lists the size, type, and location of each pin within each cell. The term Def is an acronym for Design Exchange Format and is a file that defines the layout of the various cells within the chip, akin to a "global real estate" layout for the chip. The Def file lists the coordinates, orientation, type, and routing for each cell within the chip. As can be understood, together the Lef/Del files provide the information for locating every cell within the chip and every pin within each cell, however, these files provide no transistor level information. Since, historically, there was not much use of these files, engineers would either throw them away or never generate these files. However, as detailed below, the data of the Lef/def files is quite valuable for performing real-time navigation on a device during probing.

The GDS II is the industry standard for mask layout interchange format. The GDS II file has root for each type of cell, e.g., AND gate, OR gate, etc., which defines the structure of the cell. For example, boundary defines a filled polygon while a path defines a wire. The GDS II file also has references, which invokes cells or cell arrays and defines their locations. The GDS II formats defines all cells and cell locations, but does not include the cell names.

As is known in the art, the callout log, 225, lists cell names, but not their locations. Additionally, the callout log names the specific pin where a failure has been detected; however, for TRE probing one needs to know the diffusion location since the emission comes from the diffusion area, not from the pin. The following embodiment of the present invention illustrates how a computer may be used to identify the proper diffusion location for TRE probing.

For illustration, the description of the embodiment proceeds with respect to a fictitious callout line, illustrated as:

myand Y

"myand" illustrates the field for a specific gate; and "Y" illustrates the field for the specific pin indicating a failure. According to this embodiment, the entry in the field for the cell name is matched with the list of cell names in the Def files, 270. When a match is found, the type, location, and orientation of the cell are extracted from the Def file. For example, the Def entry for the cell may be:

| myand | AND2X1 | (100,100) | N |
|---|---|---|---| wherein "myand" is the entry in the field for the cell name, "AND2X1" is the entry in the field for the cell type (e.g. AND gate with 2 inputs and 1 output), "(100,100)" is the entry in the field for the cell location (here, what is given are the coordinate for the corner of the cell within the die), and "N" is the entry in the field for the cell's orientation within the die (e.g., North). Consequently, at this point the system possess an identification of the cell's location within the die, the cell's orientation, and the cell type.

For further illustration, another illustration of a hierarchical design (having multiple DEF Files) is provided as:

Top/mycounter/AND128 Y wherein "Top" illustrates the field for an upper-level cell; "mycounter" illustrates the field for a specific cell; "AND 128" illustrates the field for a specific gate; and "Y" illustrates the field for the specific pin indicating a failure. "Top" is defined in one Def file which is searched for location, cell type and orientation of an instance matching "mycounter." When a match is found, the type, location, and orientation of the cell are extracted from the Def file. For example, the Def entry for the cell may be:

| mycounter | COUNTER | 500,500 | FS |
|---|---|---|---| wherein "mycounter" is the entry in the field for the cell name, "COUNTER" is the entry in the filed for the cell type (e.g. a counter block), "(500,500)" is the entry in the field for the cell location (here, what is given are the coordinate for the corner of the cell within the cell "Top"), and "FS" is the entry in the field for the cell's orientation within the cell "Top" (e.g., Flip South).

Now the Def file containing the definition of "COUNTER" is searched for the entry matching "AND128". According to this embodiment, the entry in the field for the cell name is matched with the list of cell names in the Def files, 270. When a match is found, the type, location, and orientation of the cell are extracted from the Def file. For example, the Def entry for the cell may be:

| AND128 | AND2X1 | (100,100) | N |
|---|---|---|---| wherein "AND128" is the entry in the field for the cell name, "AND2X1" is the entry in the field for the cell type (e.g. and AND gate with 2 inputs and 1 output), "(100,100)" is the entry in the field for the cell location (here, what is given are the coordinate for the corner of the cell within the cell "mycounter"), and "N" is the entry in the field for the cell's orientation within the cell "mycounter" (e.g., North). Consequently, at this point the system possess an identification of the cell's location within the die, the cell's orientation, and the cell type.

Absolute coordinates of the cell top/mycounter/AND128 are calculated after performing the rotations (FS for mycounter and N for AND128) and applying offset.

The system then queries the Lef files, 270, for a cell type that matches the cell type obtained from the Def file. When a corresponding cell type is found in the Lef files, the system fetches the location data of the specific pin indicated in the callout list. Consequently, at this point the system possess an identification of the cell's location within the die (from Def), the cell's orientation (from Def), and the location within the cell of the specific pin (from Lef).

However, as indicated above, the emission naturally occurs within the diffusion layer. Therefore, the system needs to identify the location of the diffusion corresponding to the indicated pin. To obtain this information the system queries the GDS II files, 275. The GDS II files do not contain cell names or pin names. However, the GDS II files have information relating to layout and placement of standard cell types. Therefore, the system queries the GDS II for a cell type that matches the cell type obtained from the Def files. Once a match is found, the system crosses the GDS's diffusion areas for that cell type with the coordinates of the pin obtained from the Lef files. When an area is found to be overlapping, it is indicated as the location to be probed. Consequently, at this point the system possess an identification of the cell's location within the die (from Def), the cell's orientation (from Def), and the location within the cell of a diffusion layer that corresponds to the specific pin (from crossing GDS II and pin polygons). This information is provided as result 265, to indicate the proper place for placing the probe for the emission test.

FIG. 3 is a schematic of a section of a die illustrating an embodiment of the subject invention. A section of the die is shown at 300, and includes cell 310. The Def files for this chip include the name of cell 310, the coordinate of corner 320 of the cell within the die 300 and the orientation of the cell within the die 300. Therefore, using the name of the cell, the inventive system uses the Def file to find the corner 320 and orientation of the cell. As is shown in this example, this cell includes contacts labeled Vss, Vdd, A, B, and Y. In this embodiment, the Lef files are queried using the cell type obtained from the Def files. The Lef files for this chip would have a list of corner coordinates for all contacts of this cell type. For example, for contact A, the Lef files will include the coordinates of corners 330 and 335. However, since using two coordinates one can only construct a rectangle, the coordinates for a more complex shape are provided in the form of multiple rectangle corners. For example, for pin Y, the coordinates would be for three rectangles. Thus, for pin Y, the coordinates may be (340,345), (350,355), and (360, 365), indicating three rectangles that together form the pin Y.

FIG. 4 is an illustration of fictitious diffusion areas stored in the GDS II files for the cell shown in FIG. 3. The coordinates of the various diffusion polygons are obtained from the GDS II files using the type of cell obtained from the Def files. The coordinates of the polygons from the GDS II files are crossed with the coordinates of the rectangles of the pin Y from the callout log, using the coordinates obtained from the Lef file. As illustrated in FIGS. 3 and 4, when polygon 400 is crossed with the rectangles of pin Y—as schematically illustrated by broken-line arrow 410 and broken-line rectangle 400', dotted area 380 is found to be overlapping. This is the area where diffusion and pin contact are overlapping and is the area where emission is likely to be found. Therefore, the coordinates of this area are issued by the inventive system as the location to place the probe. FIG. 5 depicts this cross operation, wherein pin Y is crossed with diffusion area 400, resulting in probing area PA.

FIG. 6 is a schematic of a section of a die illustrating another embodiment of the subject invention. FIG. 6 depicts an example that is similar to the embodiment shown in FIG. 3. However, here the operation for finding the location to be probed is a two-tiered operation. In general, the diffusion layer is much larger than the active area where photon emission occurs. Therefore, it is advantageous to further delineate the area for testing to be as limited as possible to active areas. To accomplish that, in a first step two layers from the GDS II are crossed so as to obtain an area that is limited to the active areas. Then, the result is crossed with the coordinates of the pin layer, Y, obtained from the Lef file. In this manner, the area to be inspected is delineated to include the active area that is below the failed pin.

The first step is shown in FIG. 7, wherein a fictitious diffusion layer 700 and a fictitious poly layer 702 are illustrated. In the first step the area of the diffusion layer 700 is crossed with the area of the poly layer 702 to obtained the overlapping area 704. By crossing the diffusion layer with the poly layer, the resulting area is limited to active section of the transistor. The result is then crossed with the pin area, as shown in FIG. 6, wherein area 604' is crossed with pin Y to result in area 680. This is also illustrated in FIGS. 8A and 8B, wherein FIG. 8A illustrate the first step of crossing the area 700 of the diffusion layer with area 702 of the poly layer to obtain area 704. FIG. 8B illustrates crossing area 704 which was obtained from crossing the GDS II data, with the area of pin Y, which was obtained from the Lef files, to result in area PA for placing the probe.

To illustrate, in order to delineate probing area in an NMOS transistor, in the first step an AND operation is performed using the polygons of the poly and the N-diffusion layers obtained from the GDS II files. The result is then used to perform an AND operation with the polygon of the pin from the Lef files. This delineates an area that is most likely to result in photon emission corresponding to the pin in an NMOS transistor. For a PMOS transistor the polygons for the poly and the p-diffusion layers are crossed, and the result is crossed with the pin polygon. This results in a probing area that is most likely to result in photo emission from a PMOS transistor.

Figure 9:
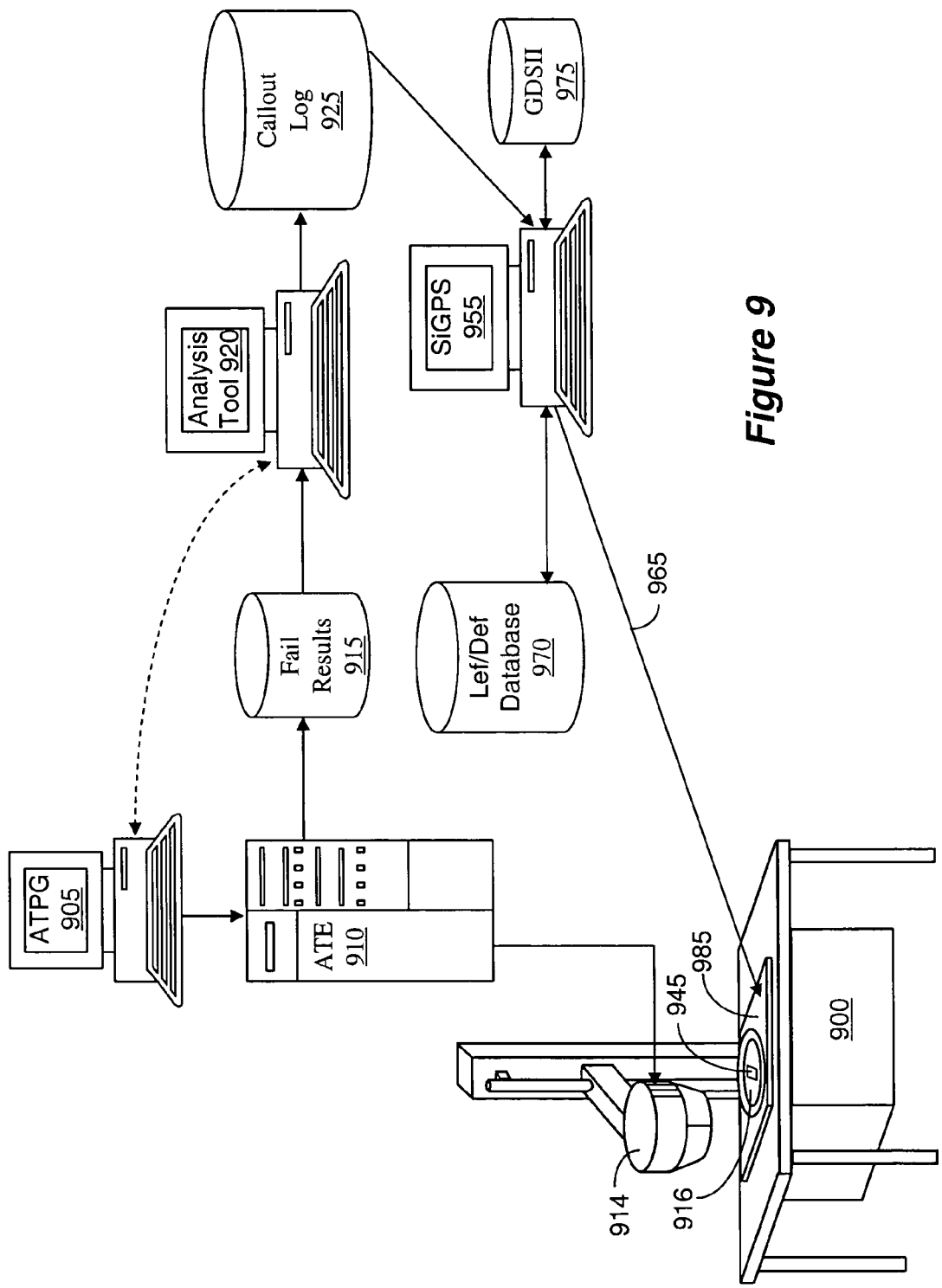
FIG. 9 is a diagram illustrating another embodiment of the present invention.

FIG. 9 depicts another embodiment of the present invention. According to this embodiment, a system and method are provided to enable automatic alignment of a prober, 900, to a proper location on the DUT, 945, for investigation. As shown, ATE 910 provides the test vectors to the tester head 914. The tester head applies the test vectors to the DUT 945 via adapter 916. The prober 900 may be any of the prober mentioned above, such as LIVA, TIVA, emission testers, etc. An x-y stage is provided so that the prober can be properly aligned to a desired location on the DUT. The fail result is sent out from the ATE 910 as in the previous embodiments and the SiGPS 955 interrogates the Lef/Def files 970 and the GDSII files 975 so as to determine the locations on the DUT that should be probed by prober 900, using any of the above described methods. When the SiGPS 955 determines a location on the DUT to be probed, the SiGPS sends driving signals 965 to the x-y stage so that the prober is aligned with the location on the DUT to be probed. Generally, there are two ways of accomplishing the alignment by the stage: 1. the DUT is connected to the stage so that the stage moved the DUT to be aligned with the prober, or 2. the DUT is stationary and the prober is movable by the stage. The end result, however, is the same: to align the probing axis of the prober with the location on the DUT to be probed. For example, when the prober is an optical tester, e.g., emission microscope, the probing axis is the optical axis of the collection optics.

Figure 10B:
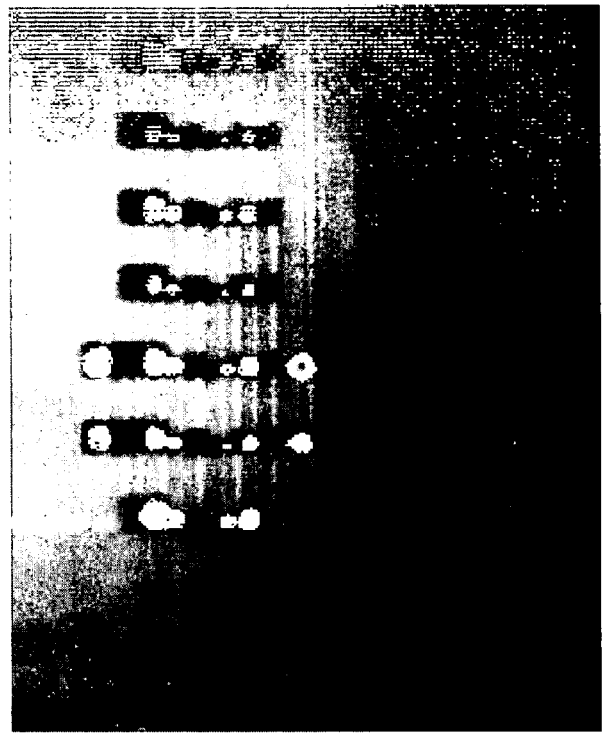
FIGS. 10a and 10b are emission images of a DUT obtained using an emission prober IREM™ available from Credence System Corporation.
Figure 10A:
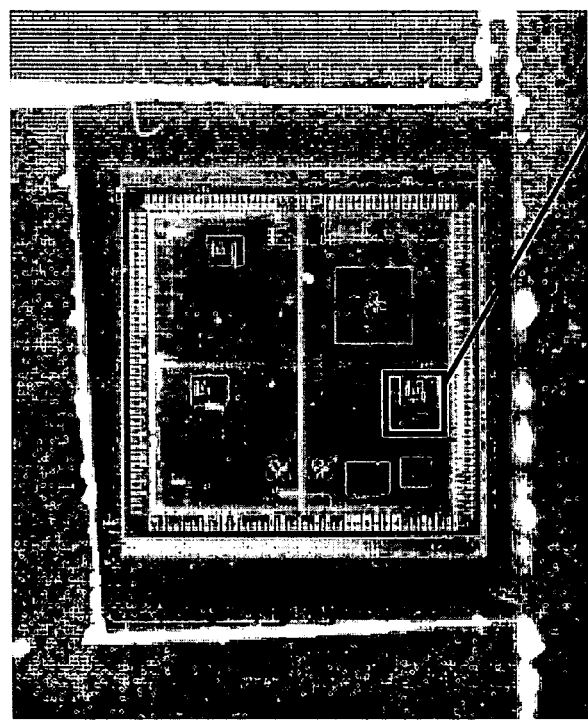

Another aspect of the invention relates to the reverse procedure, i.e., that of finding an interesting probing location on the DUT and determining what circuit element of the DUT that location corresponds to. For example, FIGS. 10a and 10b are emission images of a DUT obtained using an emission prober IREM™ available from Credence System Corporation. The image in FIG. 10a was obtained using a 1× lens. The marked rectangle shows where some emission spots have been detected. The image of FIG. 10b is an image of the area marked in the rectangle, but using a 100× lens. In the image of FIG. 10b multiple emissions can be seen. However, it is impossible to decipher what circuit elements emit these emissions. The current inventors have developed a system and method to enable such determination easily and rapidly.

For a better understanding, reference is made to FIG. 11, which is a flowchart depicting conventional process for designing a chip. In step 1100, the Register Transfer Level is created using either Verilog or VHDL Hardware Description Languages (HDL). A Hardware Description Language is a language used to describe a digital system at various levels. For example, an HDL might describe the layout of the wires, resistors and transistors on an Integrated Circuit (IC) chip, i.e., the switch level. Or, it might describe the logical gates and flip flops in a digital system, i.e., the gate level. An even higher level describes the registers and the transfers of vectors of information between registers. This is called the Register Transfer Level (RTL). The RTL then undergoes synthesis (usually using tools such as Synopsys or Synplicity) at step 1105 to obtain a netlist 1110. A "netlist" describes the connectivity of an electronic design, including cell instances and their attributes, nets and connection ports of the nets on each instance. The netlist is generally stored in an EDIF (Electronic Design Interchange Format) or Verilog format. Once the RTL has been synthesized and a netlist created, a design schematic 1115 is generated (Also called EDDM design database) to drive the IC layout tools. The design schematic 1115 can be viewed using any conventional schematic viewer tools, such as SpiceVision®, GateVision®, available from Concept Engineering of Germany or Debussy from Novas Software of San Jose, Calif. The netlist is also used to generate the place and route design 1120, which basically determines the "real estate" layout of the chip. Then the layout 1125 is created, which is basically the layout of the various masks used to generate the chip. The layout is exported into the GDS II which is used to create the masks, as explained above.

According to various embodiments of the invention described below, various elements of the process of FIG. 11 are utilized to assist in determining which element is responsible for an event detected by a prober. That is, various embodiments described below use "back tracing" and other processes to investigate the potential element involved in generating the detected event.

Figure 13:
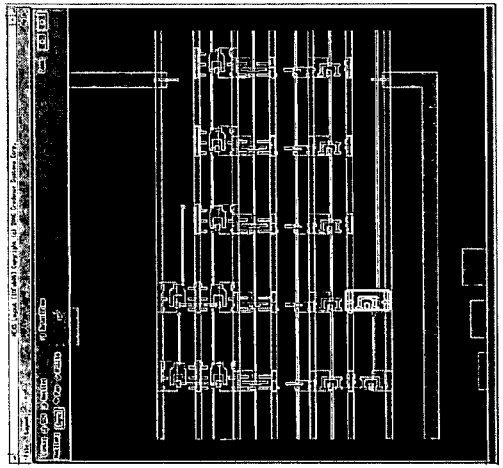
FIG. 13 is a screenshot showing corresponding locations in the layout tool from the CAD coordinates.
Figure 14:
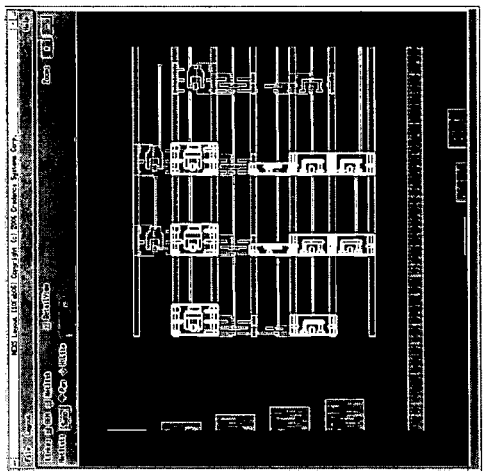
FIG. 14 shows the cells corresponding to the list of names.

FIG. 12 is a schematic diagram illustrating an embodiment of the process of the invention. When an irregular event, e.g., an emission spot 1200, is to be investigated, its coordinates on the prober are translated to CAD coordinates of the DUT. When the prober has been aligned to the corresponding CAD database (i.e., CAD alignment), this translation can be done automatically. Otherwise, this can be done manually by reference to the layout. To illustrate, with respect to the emission spots shown in FIGS. 10A and 10B, FIG. 13 is a screenshot showing corresponding locations in the layout tool from the CAD coordinates. The coordinates are applied to the inventive SiGPS 1255, whereupon the SiGPS interrogates the Lef/Def database 1270 to obtain a list of hierarchical cells that correspond to the (x,y) coordinates. Notably, the coordinate of the emission spot, or a bounding box drawn around the emission spot, may be used to query the Def files. Here, two alternatives are illustrated. According to one option, the SiGPS 1255 interrogates the Lef/Def files 1210/1220 that were generated by the place and route 1120. As is known, these are ASCII files and are rather large and contains much information that is not necessary for the implementation of this invention. Therefore, according to another embodiment, the ASCII Lef/Def files are first converted 1225 to a binary form and stored as Lef/Def SiGPS database 1270. The SiGPS 1255 then interrogates the Lef/Def SiGPS database 1270 instead of the original ASCII Lef/Def files 1210/1220. The Lef/Def SiGPS files are smaller and easier to access and read than the original ASCII Lef/Def files, which enables faster processing by the SiGPS 1255. The query returns the hierarchical nets or cells or vias that were placed or routed at the specified locations or regions. FIG. 14 shows the cells corresponding to the list of names. This list from the Lef/Def files enables extraction of the name of the instance at the emission spots. Using the hierarchical list, the elements can be traced using schematic tool 1295 and then analysis can be made to provide a report 1285 of the suspect elements.

More specifically, in this example the list of coordinates that were used in the query were:

(−1820.5 −1919.98)
(−1820.4 −1930.95)
(−1815.6 −1930.1)
(−1817.620972 −1920.989014) (−1812.580933 −1918.348999)
(−1812.442017 −1931.588989) (−1807.401978 −1930.269043)
(−1812.442017 −1920.989014) (−1807.401978 −1919.669067)
(−1802.370972 −1931.588989) (−1797.330933 −1927.629028)
(−1802.370972 −1920.989014) (−1797.330933 −1917.029053)
(−1817.620972 −1942.139038) (−1812.580933 −1939.499023)
(−1802.370972 −1942.139038) (−1797.330933 −1938.179077)

wherein the first 3 lines relate to specific locations, while the remaining lines relate to bounding boxes, the first coordinate set being of the bottom-left corner of the box, while the second coordinate set being of the top-right corner of the box. These coordinates can be obtained from the emissions tool, as shown in FIG. 10b, or from the layout tool as shown in FIG. 13. The list of hierarchical cells that the Lef/Def query returns were:

i_ob8_i1/ic/c1s2tap
i_ob8_i1/ic/c1s1tap
i_ob8_i1/ic/c1s2
i_ob8_i1/ic/c1s3
i_ob8_i1/ic/c2s2
i_ob8_i1/ic/c2s3
i_ob8_i1/ic/c4s2
i_ob8_i1/ic/c4s3
i_ob8_i1/ic/c1s1
i_ob8_i1/ic/c4s1

These cells are shown in FIG. 14.

Figure 15:
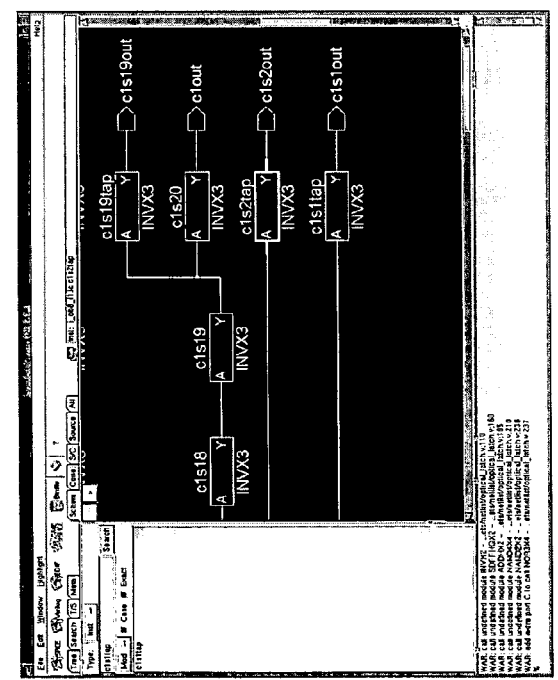
FIG. 15 shows instance i_ob8_i1/ic/c1s1tap in a schematic tool.
Figure 16:
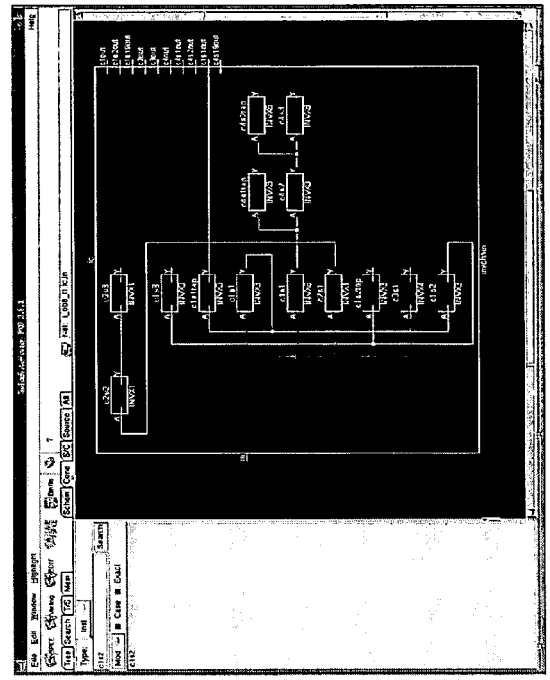
FIG. 16 is a screenshot of a schematic tool.

Once the hierarchical cell names have been obtained, they can be used to locate the corresponding circuit elements in the schematic tool. For example, FIG. 15 shows instance i_ob8_i1/ic/c1s1tap in a schematic tool, also called the "logic cone." In this example, each and every cell reported from the above-mentioned query was located in the schematic tool, as shown in FIG. 16. In this example, the analysis of the circuits shows that each of the cells are being driven by the same net i_ob8_i1/ic/in, thereby assisting in identifying the source of the problem. Of course, other findings can help in identifying the failure. For example, the analysis can be used to find whether there is one common net going through the emission spots. If there are different nets going through emissions spots, an investigation can be made to check whether these nets trace back to a common net or to same cell instance. On the other hand, if there is no common source, it can be investigated whether each of these nets have same type of via structure. Additionally, it can be investigated whether each of the nets going through the emission spots had same routing rules or all of the emission spots are from the same type of cell, i.e., the instance names are of the same standard cell. In the case of single emission spot, one can investigate all of the nets going through the emission spot and compare the images of the net metal trace on the silicon with the images from the layout to see if they differ.

Figure 17:
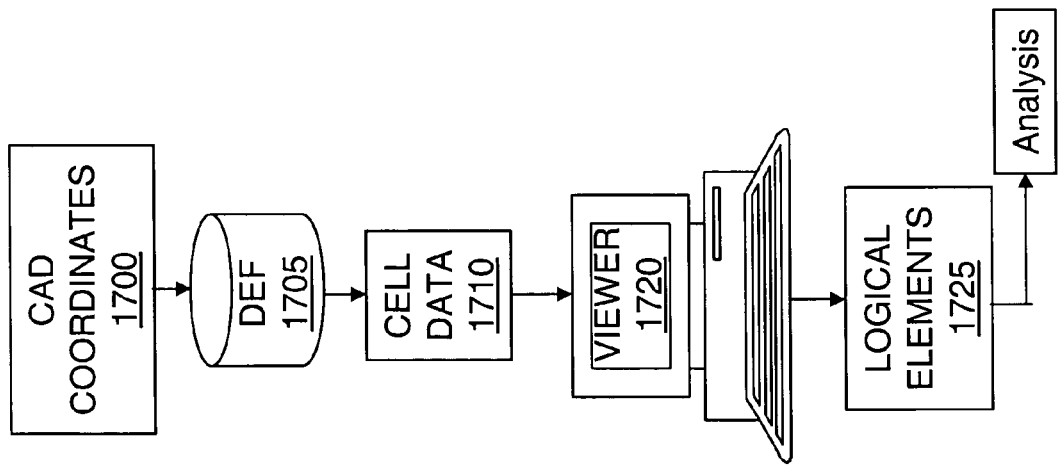
FIG. 17 is a flowchart illustrating a method for identifying logical elements on device under test according to an embodiment of the invention.

FIG. 17 is a flowchart illustrating a method for identifying logical elements on device under test according to an embodiment of the invention. In step 1700 the spatial coordinates of the point or area of interest are determined. These may be, for example, photoemission locations on the DUT. At step 1705 the Def file is then interrogated to locate Def entries matching these spatial coordinates. At step 1710 cell data corresponding to the coordinates is obtained. The cell data correspond to Def entries of cell instance name and cell type. Using the cell data, the schematic viewer is queried at 1720 to locate schematic entries matching these cell instance names and types. From the schematic viewer the suspect logical elements are determined at 1725. By knowing which logical elements are suspect, one can analyze the logical layout to determine the root-cause of the problem.

Figure 18:
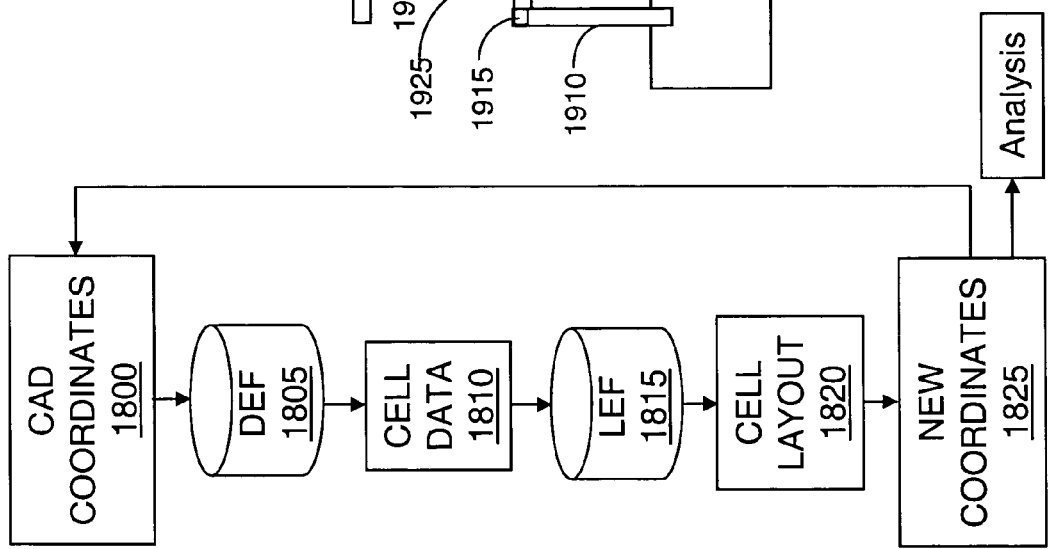
FIG. 18 is a flowchart illustrating another method for identifying elements on the device under test according to an embodiment of the invention.

FIG. 18 is a flowchart illustrating another method for identifying elements on the device under test according to an embodiment of the invention. In step 1800, the spatial coordinates of the point or area of interest are determined. These may be, for example, photoemission locations on the DUT. At step 1805, the Def file is interrogated to locate Def entries matching the spatial coordinates. At step 1810 cell data corresponding to the coordinates is obtained. The cell data correspond to Def entries of cell instance name and cell type. At step 1815 the Lef file is interrogated to obtain entries corresponding to the cell types found in step 1810. At step 1820, the cell layout data corresponding to the Lef entries are obtained. The cell layout data corresponds to cell width and height, and pin information.

Figure 19:
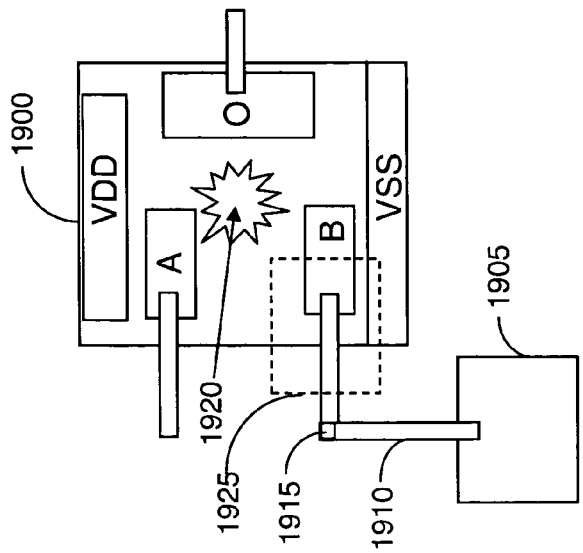
FIG. 19 is a diagram of an example of the operation of the method according to an embodiment of the invention.

FIG. 19 is a diagram of an example of the operation of the method according to an embodiment of the invention. FIG. 19 depicts an example of a partial layout of a DUT, showing AND cell 1900 and OR cell 1905, connected by net 1910 having via 1915. In this example, it is assumed that using the prober emission 1920 is detected. Using the example of FIG. 18, the coordinates of the emission spot 1920 are used to interrogate the Def file. The Def file would return data corresponding to cell 1900, i.e., the cell name and cell type (e.g., and128, AND2X1). Then, the Lef file is interrogated to find an entry for the cell type fetched from the Def file, i.e., AND2X1. Once a corresponding match is found, the various elements of the cell can be determined, such as ports A, B, O, VDD and VSS, as shown in FIG. 19. At this point, using this new information, one may wish to investigate the various elements of the cell to see which one may lead to the root-cause of the emission. For example, the coordinates of area 1925 can be used to interrogate the Def files. In this example, the Def file will return the cell data of port B and net 1910, as both are within the area 1925. As can be understood, the net data can be used to interrogate the Lef file to find that it includes via 1915 and that it is connected to OR cell 1905. Such iterations can be made on any part to see which parts may lead to some commonality that may cause the emission, such as common net, common via, etc.

While the invention has been described with reference to particular embodiments thereof, it is not limited to those embodiments. Specifically, various variations and modifications may be implemented by those of ordinary skill in the art without departing from the invention's spirit and scope, as defined by the appended claims. For example, in all of the embodiments described above, the SiGPS can be constructed beforehand as a library for the various queries. Alternatively, the SiGPS can be structured only as an engine that accesses the Lef/Def files in real time and performs the analysis described above and claimed herein.

What is claimed is:

1. A method for identifying elements on a device under test (DUT) that are suspect of causing irregularities manifested as photoemission locations on the DUT, comprising:
   a. receiving spatial coordinates of the photoemissions on the DUT;
   b. interrogating a Def file to locate Def entries matching said spatial coordinates and obtaining from said Def entries cell instance name and cell type, of corresponding cells;
   c. interrogating schematic viewer to locate schematic entries matching said cell instance name for each of said cell names.

2. The method of claim 1, further comprising the step:
   d. Analyzing said schematics entries to determine suspect elements.

3. The method of claim 2, wherein said analyzing comprises investigating whether all of the corresponding cells are being driven by a common net.

4. The method of claim 2, wherein said analyzing comprises investigating whether all of the corresponding cells are being driven by a common net or a plurality of nets; and,
   if the corresponding cells are driven by a plurality of nets, determining whether the plurality of nets are traceable back to a single parent net.

5. The method of claim 2, wherein said analyzing comprises investigating whether all of the corresponding cells are being driven by a common net or a plurality of nets; and,
   if the corresponding cells are driven by a plurality of nets, determining whether the plurality of nets are traceable back to a single cell instance.

6. The method of claim 2, wherein said analyzing comprises investigating whether all of the corresponding cells comprise same type of via structure.

7. The method of claim 2, wherein said analyzing comprises investigating whether all of the corresponding cells comprise same routing rules.

8. The method of claim 2, wherein said analyzing comprises investigating whether all of the corresponding cells comprise same cell type.

9. The method of claim 1, further comprising interrogating a Lef file to locate Lef entries matching said cell type and obtaining from said Lef entries cell width, cell height, and cell pin data.

10. A method for identifying elements on a device under test (DUT) that are suspect of causing irregularities manifested as photoemission locations on the DUT, comprising:
    a. receiving spatial coordinates of the photoemissions on the DUT; b. interrogating a Def file to locate Def entries matching said spatial coordinates and obtaining from said Def entries cell instance name and cell type, of corresponding cells; c. interrogating Lef file to obtain entries corresponding to said cell types to obtain cell width, cell height and cell pin data.

11. The method of claim 10, further comprising:
    d. using coordinates of each cell pin obtained in step (c) to interrogate the Def file to thereby obtain net name for a net connected to each pin.

12. The method of claim 10, further comprising:
    obtaining from said Def file for each net name at least one of: net connectivity, pin connectivity, metal level data, and vias data.

13. The method of claim 12, further comprising using said net connectivity to trace all relating cells connected to said net.

14. A system for probing a microchip device under test (DUT), comprising: an adapter for mounting the DUT thereupon; a prober having probing axis; a movable stage providing relative motion between the DUT and the prober so as to align the probing axis with selected locations on the DUT; a controller controlling the stage to thereby place said prober so that said probing axis correspond to determinable coordinates on said DUT; a processor preprogrammed to perform the steps: a. receive said coordinates; b. interrogating a Def file to locate Def entries matching said spatial coordinates and obtaining from said Def entries cell instance name and cell type, of corresponding cells; c. interrogating a Lef file to obtain entries corresponding to said cell types to obtain cell width, cell height and cell pin data.

15. The system of claim 14, wherein said prober is an optical prober.

16. The system of claim 15, wherein said coordinates correspond to a location of the DUT having photoemission event.

17. The system of claim 15, wherein said coordinates correspond to a location of the DUT having an irregular operation.

18. The system of claim 15, wherein said coordinates correspond to an area enclosing a location of the DUT having photoemission event.

19. The system of claim 15, wherein said coordinates correspond to an area enclosing a location of the DUT having an irregular operation.

20. The system of claim 14, wherein said processor is further programmed to perform the step:
   d. interrogate the Def file using coordinates of each cell pin obtained in step (c) to thereby obtain net name for a net connected to each pin.

21. A method for identifying elements on a device under test (DUT) that are suspect of causing irregularities manifested as photoemission locations on the DUT, comprising:
   a. converting Lef and Def files into a binary form to obtain a binary Lef/Def database;
   b. receiving spatial coordinates of the photoemissions on the DUT;
   c. interrogating the Def/Def database to locate entries matching said spatial coordinates and obtaining from said entries cell instance name and cell type, of corresponding cells;
   d. interrogating schematic viewer to locate schematic entries matching said cell instance name for each of said cell names.

22. The method of claim 21, further comprising the step:
   e. Analyzing said schematics entries to determine suspect elements.

23. The method of claim 22, wherein said analyzing comprises investigating whether all of the corresponding cells are being driven by a common net.

24. The method of claim 22, wherein said analyzing comprises investigating whether all of the corresponding cells are being driven by a common net or a plurality of nets; and,
   if the corresponding cells are driven by a plurality of nets, determining whether the plurality of nets are traceable back to a single parent net.

25. The method of claim 22, wherein said analyzing comprises investigating whether all of the corresponding cells are being driven by a common net or a plurality of nets; and,
   if the corresponding cells are driven by a plurality of nets, determining whether the plurality of nets are traceable back to a single cell instance.

26. The method of claim 22, wherein said analyzing comprises investigating whether all of the corresponding cells comprise same type of via structure.

27. The method of claim 22, wherein said analyzing comprises investigating whether all of the corresponding cells comprise same routing rules.

28. The method of claim 22, wherein said analyzing comprises investigating whether all of the corresponding cells comprise same cell type.

29. The method of claim 21, further comprising interrogating said Lef/Def database to locate an entries matching said cell type and obtaining from said entries cell width, cell height, and cell pin data.

* * * * *